United States Patent
Vignali et al.

(10) Patent No.: US 12,000,679 B2
(45) Date of Patent: Jun. 4, 2024

(54) THERMAL STORAGE FOR HIGH LOAD SHORT DURATION COOLING

(71) Applicant: Hamilton Sundstrand Corporation, Charlotte, NC (US)

(72) Inventors: Mark G. Vignali, Simsbury, CT (US); Tony Ho, Glastonbury, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 171 days.

(21) Appl. No.: 17/838,683

(22) Filed: Jun. 13, 2022

(65) Prior Publication Data

US 2023/0400284 A1    Dec. 14, 2023

(51) Int. Cl.
| | |
|---|---|
| *F41H 13/00* | (2006.01) |
| *F28D 21/00* | (2006.01) |
| *H01S 3/04* | (2006.01) |
| *H05K 7/20* | (2006.01) |

(52) U.S. Cl.
CPC .......... *F41H 13/005* (2013.01); *F28D 21/00* (2013.01); *H01S 3/04* (2013.01); *H05K 7/20309* (2013.01); *F28D 2021/0019* (2013.01)

(58) Field of Classification Search
CPC .................. F41H 13/005; F28D 21/00; F28D 2021/0019; H01S 3/04; H05K 7/20309
USPC .......................................................... 165/10
See application file for complete search history.

(56) References Cited

U.S. PATENT DOCUMENTS

| | | | |
|---|---|---|---|
| 7,980,293 B2 | 7/2011 | Jensen | |
| 10,906,150 B2* | 2/2021 | Jansen | F25B 25/005 |
| 11,028,773 B2* | 6/2021 | Karam | F02C 6/003 |
| 11,187,148 B1* | 11/2021 | MacDonald | F02C 6/06 |
| 11,326,840 B2* | 5/2022 | Khalili | F25B 1/00 |
| 11,435,145 B2* | 9/2022 | Khalili | F28D 20/02 |
| 11,692,779 B2* | 7/2023 | Rockenfeller | F25B 25/005 |
| | | | 165/10 |
| 2016/0273847 A1 | 9/2016 | Rusich et al. | |
| 2018/0231340 A1 | 8/2018 | Ranjan et al. | |
| 2018/0370013 A1 | 12/2018 | Munevar et al. | |
| 2020/0041175 A1* | 2/2020 | Rockenfeller | F25B 17/08 |
| 2020/0198750 A1* | 6/2020 | Laird | F25D 17/02 |
| 2020/0361624 A1 | 11/2020 | Klemen et al. | |
| 2021/0318076 A1 | 10/2021 | Khalili et al. | |
| 2021/0381736 A1 | 12/2021 | Rockenfeller et al. | |

(Continued)

OTHER PUBLICATIONS

European Search Report and Written Opinion for European Application No. 23178172.5; Report dated Nov. 20, 2023 (12 Pages).

*Primary Examiner* — Jon T. Schermerhorn, Jr.

(74) *Attorney, Agent, or Firm* — CANTOR COLBURN LLP

(57) ABSTRACT

A thermal management system for a directed energy weapon includes a first heat exchanger thermally coupled to the directed energy weapon and a second heat exchanger arranged in fluid communication with the first heat exchanger to form a closed loop. The second heat exchanger is thermally coupled to a secondary system and a thermal management fluid circulates within the closed loop. A thermal storage device is arranged in fluid communication with the first heat exchanger and the second heat exchanger. The thermal storage device contains a material and a mode of operation of the directed energy weapon is dependent on a condition of the material in the thermal storage device.

20 Claims, 3 Drawing Sheets

(56) References Cited

U.S. PATENT DOCUMENTS

| | | |
|---|---|---|
| 2022/0034601 A1 | 2/2022 | Khalili et al. |
| 2022/0090868 A1 | 3/2022 | Donovan et al. |
| 2022/0344889 A1* | 10/2022 | Liepmann ............... H01S 3/005 |
| 2023/0304775 A1* | 9/2023 | Paranto ................ F41H 13/005 |

* cited by examiner

THERMAL STORAGE FOR HIGH LOAD SHORT DURATION COOLING

BACKGROUND

Exemplary embodiments of the present disclosure relate to the art of a thermal management system, and more specifically, to a thermal management system for removing heat from a directed energy weapon (DEW).

Vehicles, such as aircraft, are being designed with advanced weapons like laser based direct energy weapons (DEWs). DEWs (e.g., laser weapons) may require substantial cooling at the lowest possible weight for sustained operation. DEWs typically operate at low efficiency and thus, generate a large amount of heat during operation, such as when the weapon is firing. DEW operation typically consists of relatively brief operating internals, wherein relatively large "bursts" of cooling are required, interspersed with relatively long intervals in which the weapon is quiescent, and therefore, requires little or no cooling. This large thermal transient may drive the size of the thermal management system used to control the thermal loading of the DEW. Such requirements may result in a thermal management system that is significantly oversized, inefficient and heavy for normal operating (non-lasing) modes. Therefore, a fast and efficient thermal management system is desired to address the thermal load of a DEW and to protect onboard components from thermal transients.

BRIEF DESCRIPTION

According to an embodiment, a thermal management system for a directed energy weapon includes a first heat exchanger thermally coupled to the directed energy weapon and a second heat exchanger arranged in fluid communication with the first heat exchanger to form a closed loop. The second heat exchanger is thermally coupled to a secondary system and a thermal management fluid circulates within the closed loop. A thermal storage device is arranged in fluid communication with the first heat exchanger and the second heat exchanger. The thermal storage device contains a material and a mode of operation of the directed energy weapon is dependent on a condition of the material in the thermal storage device.

In addition to one or more of the features described above, or as an alternative, in further embodiments the directed energy weapon is operable in a firing mode and a charging mode. During operation in the firing mode, an amount of heat generated by the directed energy weapon exceeds an amount of heat that can be removed from the thermal management fluid at the second heat exchanger.

In addition to one or more of the features described above, or as an alternative, in further embodiments the thermal storage device is operable as a heat sink when the directed energy weapon is in the firing mode.

In addition to one or more of the features described above, or as an alternative, in further embodiments during operation in the charging mode, the amount of heat that can be removed from the thermal management fluid at the second heat exchanger exceeds the amount of heat generated by the directed energy weapon.

In addition to one or more of the features described above, or as an alternative, in further embodiments the thermal storage device releases heat when the directed energy weapon is in the charging mode.

In addition to one or more of the features described above, or as an alternative, in further embodiments the thermal storage device is a reservoir and the material is a liquid.

In addition to one or more of the features described above, or as an alternative, in further embodiments the directed energy weapon is operable in a firing mode and a charging mode and in the charging mode, a temperature of the liquid is a minimum allowable temperature.

In addition to one or more of the features described above, or as an alternative, in further embodiments the liquid within the thermal storage device is the same as the thermal management fluid.

In addition to one or more of the features described above, or as an alternative, in further embodiments wherein the liquid within the thermal storage device is different than the thermal management fluid.

In addition to one or more of the features described above, or as an alternative, in further embodiments the material within the thermal storage device is a phase change material.

In addition to one or more of the features described above, or as an alternative, in further embodiments the directed energy weapon is operable in a firing mode and a charging mode, the phase change material transforming to a first state during the charging mode and the phase change material transforming to a second state during the firing mode.

In addition to one or more of the features described above, or as an alternative, in further embodiments the first state is a solid and the second state is a liquid.

In addition to one or more of the features described above, or as an alternative, in further embodiments the secondary system is one of a vapor cycle and an air cycle.

In addition to one or more of the features described above, or as an alternative, in further embodiments comprising a pump in fluid communication with the thermal storage device, the pump being operable to move the thermal management fluid within the closed loop.

According to an embodiment, a method of operating a thermal management system for a directed energy weapon includes circulating a thermal management fluid through a closed loop system including a first heat exchanger and a second heat exchanger, and a thermal storage device. The first heat exchanger is in thermal communication with the directed energy weapon and the second heat exchanger is in thermal communication with a secondary system. The method includes operating the directed energy weapon in a firing mode and a charging mode. In the firing mode, heat from the directed energy weapon is transferred to the secondary system and the thermal storage device. In the charging mode, heat stored within the thermal storage device is transferred to the thermal management fluid.

In addition to one or more of the features described above, or as an alternative, in further embodiments comprising transforming the directed energy weapon from the firing mode to the charging mode in response to a material within the thermal storage device being equal to or exceeding a maximum allowable temperature.

In addition to one or more of the features described above, or as an alternative, in further embodiments comprising transforming the directed energy weapon from the firing mode to the charging mode in response to substantially all of a phase change material within the thermal storage device transforming from a first state to a second state.

In addition to one or more of the features described above, or as an alternative, in further embodiments the first state is a solid and the second state is liquid.

In addition to one or more of the features described above, or as an alternative, in further embodiments comprising transforming the directed energy weapon from the charging mode to the firing mode in response to substantially all of the phase change material within the thermal storage device transforming from the second state to the first state.

In addition to one or more of the features described above, or as an alternative, in further embodiments comprising transforming the directed energy weapon from the charging mode to the firing mode in response to a material within the thermal storage device reaching a minimum allowable temperature.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
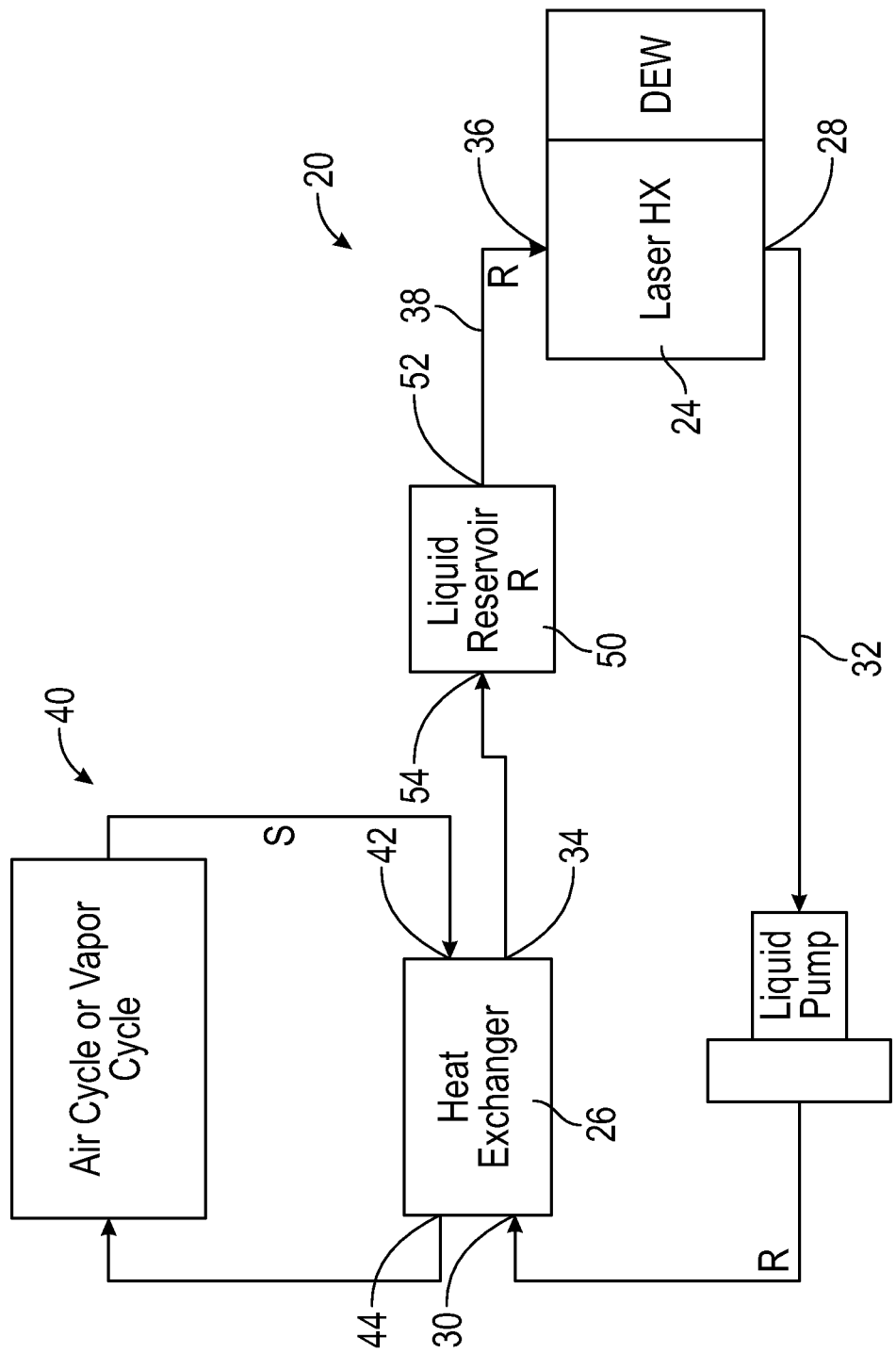
FIG. 1 is a schematic diagram of a thermal management system operable to cool a directed energy weapon according to an embodiment.

With reference now to the FIG. 1, an example of a thermal management system 20 is illustrated. In the illustrated, non-limiting embodiment, the thermal management system 20 is operable to manage the heat generated by a directed energy weapon (DEW) 22, such as a laser for example. In an embodiment, the thermal management system 20 and DEW 22 are integrated into a vehicle, such as a land vehicle or an aircraft for example.

The thermal management system 20 has a closed loop configuration through which a thermal management fluid R is configured to circulate. The thermal management fluid may be ethylene glycol and water (EGW), propylene glycol and water (PGW) or another suitable fluid. In the illustrated, non-limiting embodiment, the thermal management system 20 includes a first heat exchanger 24 and a second heat exchanger 26. An outlet 28 of the first heat exchanger 24 is arranged in fluid communication with a first inlet 30 of the second heat exchanger 26 by a conduit 32. Similarly, a first outlet 34 of the second heat exchanger 26 is arranged in fluid communication with an inlet 36 of the first heat exchanger 24 by another conduit 38.

The first heat exchanger 24 may be configured as an evaporator or a heat absorption heat exchanger and the second heat exchanger 26 may be configured as a condenser or a heat rejection heat exchanger. However, embodiments where the first heat exchanger 24 is configured as a condenser and the second heat exchanger 26 is configured as an evaporator are also contemplated herein. In the illustrated, non-limiting embodiment, the first heat exchanger 24 is arranged in thermal contact or communication with the directed energy weapon (DEW) 22 and is operable to cool or remove heat from the DEW 22. The first heat exchanger 24 may be configured as any suitable type of heat exchanger, including, but not limited to, a phase change evaporator with a high heat flux load, such as a plate fin cold plate, or jet impingement cold plate for example.

The second heat exchanger 26 may be thermally coupled to a secondary system 40 of the vehicle. In the illustrated, non-limiting embodiment, the secondary system 40 is one of a vapor cycle and an air cycle (such as a portion of an environmental control system). However, it should be understood that any suitable system of the vehicle may be used as the secondary system 40. The second heat exchanger 26 therefore includes a second inlet 42 and a second outlet 44 through which a secondary fluid S of the secondary system 40 passes. The skilled artisan will realize that the second heat exchanger 26 can be any type of heat exchanger that achieves the desired result of heat transfer with respect to the thermal management fluid R. For example, the second heat exchanger 26 can be a counterflow heat exchanger.

As shown, the thermal management system 20 may include a pump 46 operable to circulate the thermal management fluid R between the first and second heat exchangers 24, 26. Although the pump 46 is illustrated as being arranged along conduit 32 at a position between the outlet 28 of the first heat exchanger 24 and the inlet 30 of the second heat exchanger 26, it should be understood that embodiments where the pump 46 is positioned elsewhere are also within the scope of the disclosure. For example, in another embodiment, the pump 46 may be located between the first outlet 34 of the second heat exchanger 26 and the inlet 36 of the first heat exchanger 24 along conduit 38.

During operation of the thermal management system, a cool thermal management fluid R is provided to the inlet 36 of the first heat exchanger 24. Within the first heat exchanger 24, the thermal management fluid R is arranged in a heat exchange relationship with the DEW 22. Accordingly, heat from the DEW 22 is transferred to the thermal management fluid R within the first heat exchanger 24. In an embodiment, the hot thermal management fluid R at the outlet 28 of the first heat exchanger 24 is entirely or at least partially a vapor. From the first heat exchanger 24, the hot thermal management fluid R is pumped through conduit 32 to the first inlet 30 of the second heat exchanger 26.

Within the second heat exchanger 26, the thermal management fluid R is arranged in a heat exchange relationship with a cool secondary fluid S. Accordingly, heat is transferred from the hot thermal management fluid R to the cool secondary fluid S, thereby causing the hot thermal management fluid R to cool. Accordingly, the heat from the DEW 22 is discharged to the secondary fluid S of the secondary system 40 via the thermal management fluid R. The cooler thermal management fluid R at the first outlet 34 of the second heat exchanger 26 may then be provided to the first heat exchanger to repeat the cycle. As the thermal management fluid R circulates through the system 20, the thermal management fluid R may, but need not change phase.

A thermal storage device 50 may be disposed along the closed fluid loop. As shown in each of FIGS. 1 and 2, the thermal storage device 50 may be arranged between the first outlet 34 of the second heat exchanger 26 and the inlet 36 of the first heat exchanger 24. However, embodiments where the thermal storage device 50 is arranged at another location within the closed loop of the thermal management system are also contemplated herein. In the illustrated, non-limiting embodiment of FIG. 1, the thermal storage device 50 is a liquid reservoir. The liquid within the reservoir may be additional liquid thermal management fluid R, or in some embodiments, may be another fluid. In the illustrated, non-limiting embodiment of FIG. 3, the thermal storage device 50 is filled with a phase change material P, such as a wax for example.

When the DEW 22 is operational or in a firing mode, the amount of heat generated by the DEW 22 exceeds the amount of heat that can be removed by the thermal management fluid R in the first heat exchanger 24. As a result, the fluid R at the first outlet 34 of the second heat exchanger 26 is still hot. However, additional cooling of the thermal management fluid R may be performed via the thermal storage device 50. In the illustrated, non-limiting embodiment of FIG. 1, the thermal management fluid R from the heat exchanger 26 is provided to an inlet 54 arranged at a first side of the thermal storage device 50. Within the thermal storage device 50, the thermal management fluid R provided via the inlet 54 is mixed with thermal management fluid R contained within the device 50. The resulting cooler mixture of thermal management fluid R is then provided at the outlet 52, such as arranged at a second, opposite side of the thermal storage device 50, and is returned to the inlet 36 of the first heat exchanger 24 to repeat the cycle. In the illustrated, non-limiting embodiment, the inlet 54 is arranged adjacent an upper end of the thermal storage device 50 and the outlet 52 is arranged adjacent a lower end of the thermal storage device 50. Further, in an embodiment, at least one turbulator or other device configured to mix the thermal management fluid R provided at the inlet 54 with the thermal management fluid R already contained within the device 50 may be arranged within the interior of the thermal storage device 50.

Figure 2:
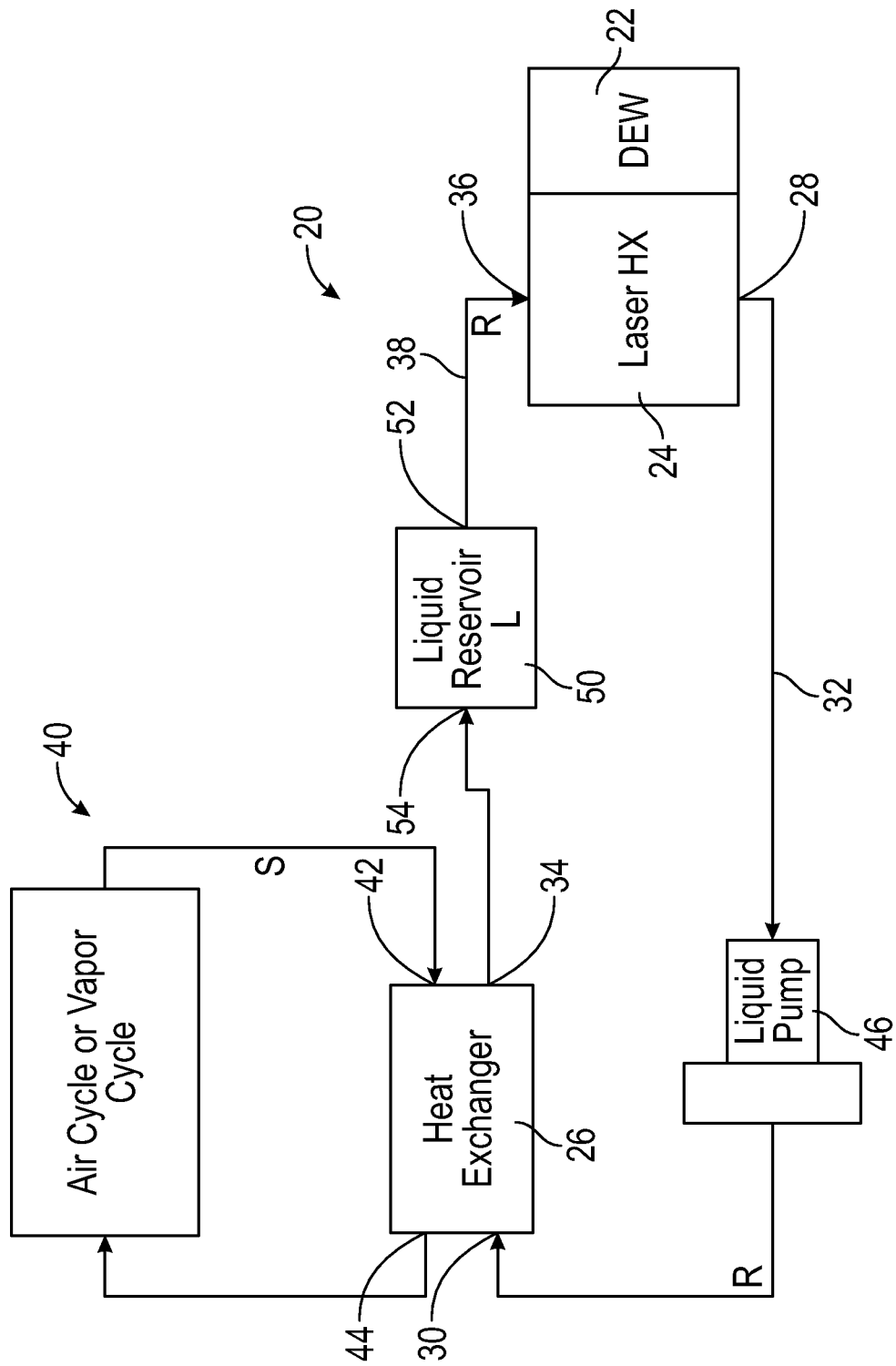
FIG. 2 is a schematic diagram of a thermal management system operable to cool a directed energy weapon according to another embodiment.

In another embodiment, best shown in FIG. 2, the liquid within the thermal storage device functions as a heat sink. As previously noted, the thermal management fluid R at the first outlet 34 of the second heat exchanger 26 is still hot. From the first outlet 34, the thermal management fluid R is configured to pass over or flow across the thermal storage device 50. In embodiments where the thermal storage device 50 contains a cool liquid L, as the hot thermal management fluid R moves across or around the thermal storage device 50, heat from the thermal management fluid R transfers to the cool liquid L within the thermal storage device 50. Accordingly, when the DEW 22 is in the firing mode, the thermal management fluid R at an outlet 52 of the thermal storage device 50 is cooler than the thermal management fluid R provided to the thermal storage device 50. The cool thermal management fluid R is then delivered to the inlet 36 of the first heat exchanger 24 via conduit 38 to repeat the cycle.

Once all or substantially all of the liquid within the thermal storage device 50 or provided at the outlet 52 thereof is heated to or beyond a temperature threshold, no further cooling may be performed by liquid within the thermal storage device 50. Accordingly, once the temperature of the liquid L/R within the thermal storage device 50 or at the outlet 52 thereof meets or exceeds the maximum allowable temperature, operation of the DEW 22 in the firing mode is ceased, such as by transformation to a charging or recharging mode. In an embodiment, the size of the thermal storage device 50 is selected to provide adequate thermal capacitance such that the temperature of the liquid does not exceed the maximum allowable temperature.

When the DEW 22 is in a charging or recharging (not firing) mode, the amount of heat that can be discharged by the thermal management system 20 exceeds the amount of heat generated by the DEW 22 in the charging mode. As a result, the additional cooling capacity of the system 20 allows the thermal management fluid R to not only cool the DEW 22, but also to cool the liquid within the thermal storage device 50. As the cool thermal management fluid R output from the second heat exchanger 26 passes over the thermal storage device 50, heat from the liquid transfers to the thermal management fluid R, thereby cooling the liquid L/R. However, the temperature of the thermal management fluid R provided to the first heat exchanger 24 is still sufficient to perform the required cooling of the DEW 22. During charging, the temperature of the liquid L within the thermal storage device may be cooled to a minimum allowable temperature.

Figure 3:
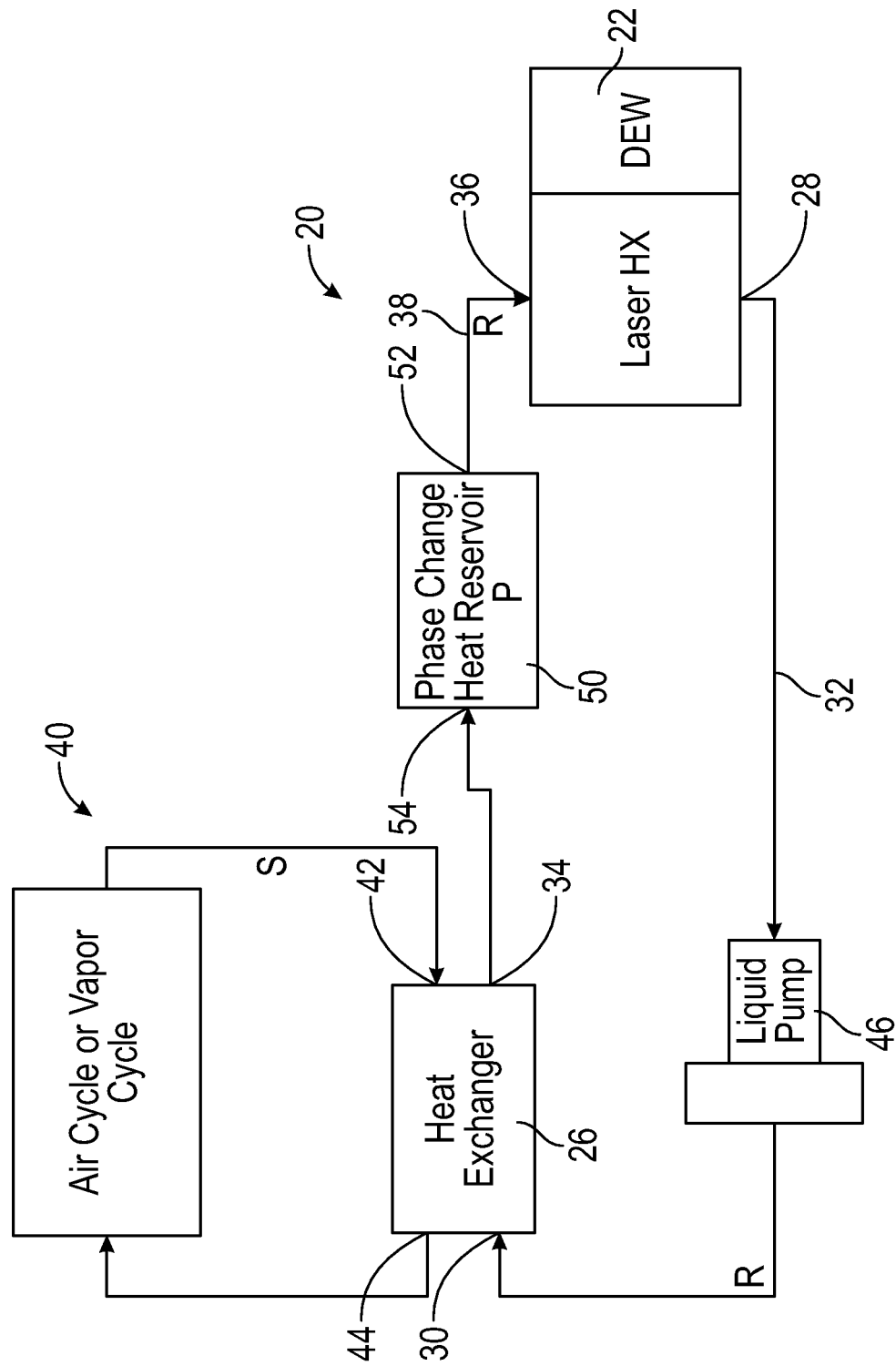
FIG. 3 is a schematic diagram of another thermal management system operable to cool a directed energy weapon according to yet another embodiment.

Operation of the thermal management system of FIG. 3 is substantially similar to FIG. 2. With reference to FIG. 3, as previously noted, the thermal management fluid R at the first outlet 34 of the second heat exchanger 26 is still hot. From the first outlet 34, the thermal management fluid R is configured to pass or flow across the thermal storage device 50. As the thermal management fluid R moves across or around the thermal storage device 50, heat from the thermal management fluid R transfers to the phase change material P within the thermal storage device 50. This heat transfer not only cools the thermal management fluid R, but also causes at least a portion of the phase change material P to change from a first state, such as a solid for example, to a second state, such as a liquid for example. However, embodiments where the first state is a liquid and the second state is a gas are also contemplated herein.

The cool thermal management fluid R at an outlet 52 of the thermal storage device 50 is then provided to the inlet 36 of the first heat exchanger 24 to repeat the cycle. Such operation may continue until all of the phase change material P has transformed to the second state. Once all or substantially all of the phase change material P has transformed to the second state, no further cooling of the thermal management fluid R is performed by the phase change material P, and therefore the maximum cooling of the thermal management system 20 has been reached. Accordingly, in response to the phase change material P being in the second state, the DEW 22 may be transformed from the firing mode to a charging or recharging (not firing) mode.

When charging, the cooling required by the DEW 22 is significantly less than required during operation of the DEW 22 in the firing mode. Accordingly, the thermal management fluid R may be sufficiently cooled within the second heat exchanger 26. The cool thermal management fluid R output from the first outlet 34 of the second heat exchanger 26 is then used to cool the phase change material P within the thermal storage device 50. This cooling of the phase change material P causes the phase change material P to transform from the second state back to the first state. Once all or substantially all of the phase change material P has returned to the first state, the DEW 22 may be transformed to the firing mode as desired. Accordingly, the mode of the DEW 22 may therefore be dependent on a condition, such as temperature or state for example, of the thermal storage device 50, or the material within the thermal storage device 50.

A thermal management system 20 having a thermal storage device as described herein allows the thermal management system to be sized based on the average cooling load for the DEW 22, rather than the maximum cooling load. In addition, the thermal management system 20 is smaller and requires less power than existing systems.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A thermal management system for a directed energy weapon comprising:
   a first heat exchanger, the first heat exchanger being thermally coupled to the directed energy weapon;
   a second heat exchanger arranged in fluid communication with the first heat exchanger to form a closed loop, wherein the second heat exchanger is thermally coupled to a secondary system and a thermal management fluid circulates within the closed loop; and
   a thermal storage device arranged in fluid communication with the first heat exchanger and the second heat exchanger, the thermal storage device containing a material;
   wherein a mode of operation of the directed energy weapon is dependent on a condition of the material in the thermal storage device.

2. The thermal management system of claim 1, wherein the directed energy weapon is operable in a firing mode and a charging mode, and during operation in the firing mode, an amount of heat generated by the directed energy weapon exceeds an amount of heat that can be removed from the thermal management fluid at the second heat exchanger.

3. The thermal management system of claim 2, wherein the thermal storage device is operable as a heat sink when the directed energy weapon is in the firing mode.

4. The thermal management system of claim 2, wherein during operation in the charging mode, the amount of heat that can be removed from the thermal management fluid at the second heat exchanger exceeds the amount of heat generated by the directed energy weapon.

5. The thermal management system of claim 4, wherein the thermal storage device releases heat when the directed energy weapon is in the charging mode.

6. The thermal management system of claim 1, wherein the thermal storage device is a reservoir and the material is a liquid.

7. The thermal management system of claim 6, wherein the directed energy weapon is operable in a firing mode and a charging mode and in the charging mode, a temperature of the liquid is a minimum allowable temperature.

8. The thermal management system of claim 6, wherein the liquid within the thermal storage device is the same as the thermal management fluid.

9. The thermal management system of claim 6, wherein the liquid within the thermal storage device is different than the thermal management fluid.

10. The thermal management system of claim 1, wherein the material within the thermal storage device is a phase change material.

11. The thermal management system of claim 10, wherein the directed energy weapon is operable in a firing mode and a charging mode, the phase change material transforming to a first state during the charging mode and the phase change material transforming to a second state during the firing mode.

12. The thermal management system of claim 11, wherein the first state is a solid and the second state is a liquid.

13. The thermal management system of claim 1, wherein the secondary system is one of a vapor cycle and an air cycle.

14. The thermal management system of claim 1, further comprising a pump in fluid communication with the thermal storage device, the pump being operable to move the thermal management fluid within the closed loop.

15. A method of operating a thermal management system for a directed energy weapon, the method comprising:
   circulating a thermal management fluid through a closed loop system including a first heat exchanger and a second heat exchanger, and a thermal storage device, the first heat exchanger being in thermal communication with the directed energy weapon and the second heat exchanger being in thermal communication with a secondary system;
   operating the directed energy weapon in a firing mode, wherein in the firing mode, heat from the directed energy weapon is transferred to the secondary system and the thermal storage device; and
   operating the directed energy weapon in a charging mode, wherein in the charging mode, heat stored within the thermal storage device is transferred to the thermal management fluid.

16. The method of claim 15, further comprising transforming the directed energy weapon from the firing mode to the charging mode in response to a material within the thermal storage device being equal to or exceeding a maximum allowable temperature.

17. The method of claim 15, further comprising transforming the directed energy weapon from the firing mode to the charging mode in response to substantially all of a phase change material within the thermal storage device transforming from a first state to a second state.

18. The method of claim 17, wherein the first state is a solid and the second state is liquid.

19. The method of claim 17, further comprising transforming the directed energy weapon from the charging mode to the firing mode in response to substantially all of the phase change material within the thermal storage device transforming from the second state to the first state.

20. The method of claim 15, further comprising transforming the directed energy weapon from the charging mode to the firing mode in response to a material within the thermal storage device reaching a minimum allowable temperature.

* * * * *